(12) United States Patent
Smith et al.

(10) Patent No.: US 6,733,607 B2
(45) Date of Patent: May 11, 2004

(54) EMBEDDED HERMETIC CAVITY FORMATION IN LOW TEMPERATURE COFIRED CERAMIC

(75) Inventors: Brian R. Smith, Indialantic, FL (US); Randy T. Pike, Grant, FL (US); C. Michael Newton, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 73 days.

(21) Appl. No.: 10/121,580

(22) Filed: Apr. 15, 2002

(65) Prior Publication Data

US 2003/0192636 A1 Oct. 16, 2003

(51) Int. Cl.[7] .............................................. C03B 29/00
(52) U.S. Cl. ................. 156/89.11; 156/89.12; 156/89.23; 264/610
(58) Field of Search ............................ 156/89.11, 89.12, 156/89.23, 155, 257, 292; 264/610, 629

(56) References Cited

U.S. PATENT DOCUMENTS 4,833,000 A * 5/1989 Trickett et al. ............. 428/137
5,176,771 A    1/1993 Bravo et al.
5,795,422 A * 8/1998 Chatterjee et al. ......... 156/89.12

FOREIGN PATENT DOCUMENTS

JP          53581        * 7/1991

OTHER PUBLICATIONS

"Bulk Ferrite Fabrication," IBM Technical Disclosure Bulletin, vol. 6, issue 10, Mar. 1964, p. 42.*
Gongora–Rubio, M.R., et al., "Overview of Low Temperature Co–Fired Ceramics Tape Technology for Meso–System Technology for (MsST)", pp. 222–241, Sensors and Actuators A 89, 2001.

* cited by examiner

*Primary Examiner*—Melvin C. Mayes
(74) *Attorney, Agent, or Firm*—Duane Morris LLP

(57) ABSTRACT

A method for forming a low temperature cofired ceramic (LTCC) device includes forming a channel in a first LTCC tape layer. A wax is inserted in the channel. The wax is of a type that burns out at a temperature below a sintering temperature of the first LTCC tape layer. At least a second LTCC tape layer is stacked on the first LTCC tape layer to form a stack. The stack is pressed sufficiently for the first and second layers to bond into a laminate. The laminate is fired at the sintering temperature to form a sintered ceramic structure from the first and second LTCC tape layers, so that all or substantially all of the wax is burned out from the channel.

7 Claims, 1 Drawing Sheet

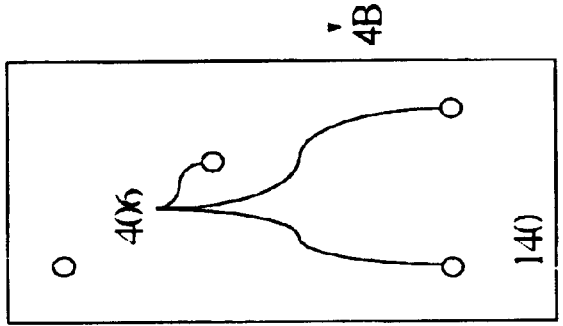
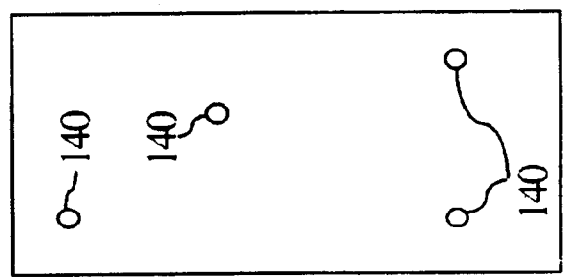
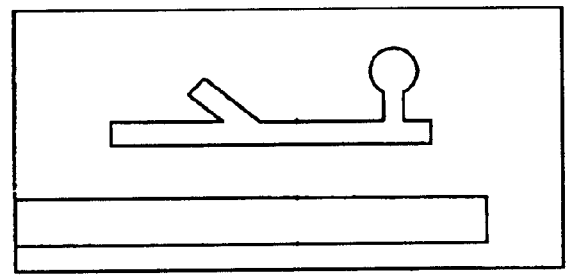
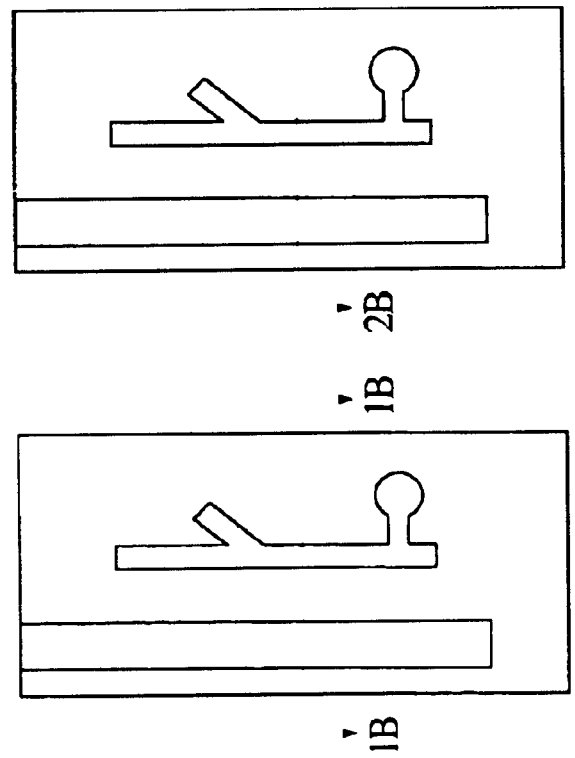
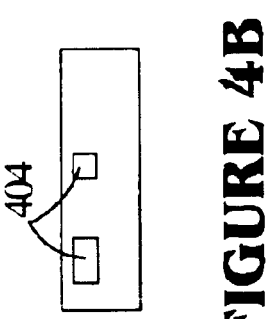
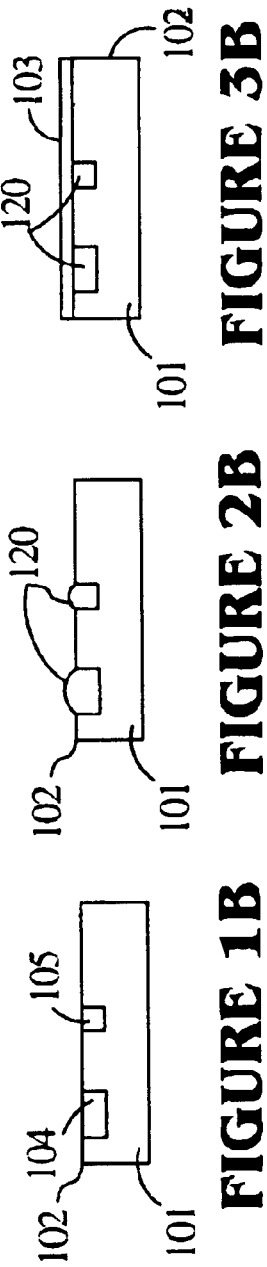

EMBEDDED HERMETIC CAVITY FORMATION IN LOW TEMPERATURE COFIRED CERAMIC

The U.S. Government has a paid-up license in this invention and the right in limited circumstances to require the patent owner to license others on reasonable terms as provided for by the terms of (contract No. SA2369-23122PG.) awarded by DARPA.

FIELD OF THE INVENTION

The present invention relates to hybrid circuits generally, and more specifically to hybrid circuits formed using low temperature cofired ceramic materials.

BACKGROUND OF THE INVENTION

Multilayer substrates for hybrid microcircuits may be advantageously fabricated using a low temperature cofired ceramic process such as the process described in U.S. Pat. No. 5,176,771, which is incorporated by reference herein. This technology utilizes dielectric sheets in the form of low-temperature-cofired-ceramic (LTCC) tape. The tape contains a material such as a mixture of glass and ceramic fillers, which sinter at about 850° C., and exhibits thermal expansion similar to Alumina. The LTCC tape sheets are metallized to make a ground plane, signal plane, bonding plane, or the like, or they may be formed with vias, which are filled with metallizations to form interconnect layers. The sheets of tape are stacked on each other, laminated together at a relatively low laminating temperature and pressure, and then fired to sinter the ceramic material in the tape.

As power consumption and circuit density in hybrid circuits increases, it has become necessary in some instances to provide embedded cooling channels or cavities in the substrate. These channels may conduct a cooling gas or, for some high-power or high density circuits, a cooling liquid. The ability to form embedded channels in LTCC substrates is important for emerging miniaturized electronics systems.

The process for fabricating embedded open cavities in low temperature co-fire ceramic substrates has been very difficult. Prior efforts included multi-step lamination build-ups with specially-cut mylar stabilizers and inserts that needed to be removed before sintering the substrate.

Cavity feature geometries were very difficult to preserve through the lamination and firing process. These structures are susceptible to plastic deformation upon lamination or under the stress of body forces (e.g., gravity) when the glass transition temperature of the glass binder is reached. Open cavities tended to sag or collapse during lamination and sintering. When an LTCC tape with holes or channels having dimensions over 400 micrometers is laminated, the tapes above and below the holes or channels deform in the inside of the holes or channels.

Previous solutions to the above problems required exotic materials and expensive SLA equipment [What does SLA stand for?] to fabricate preforms.

For example, M. R. Gongora-Rubio et al., "Overview of Low Temperature Co-Fired Ceramics Tape Technology for Meso-System Technology (MsST)", Sensors and Actuators A 89 (2001), pp 222–241, sugggests the use of fugitive phase materials intended to disappear during firing for supporting bridging structures. As an example, carbon black is suggested as a fugitive phase. Sintering is accomplished in a neutral or just slightly oxidizing atmosphere. The gasification of the carbon (reaction with oxygen to form carbon mono, and dioxide) is slow and little carbon black is lost before the bridging or suspended ceramic structure becomes rigid. After that point, one can open the furnace to air and burn-off the carbon black. The author describes that after the carbon black gasification and sintering, the upper and lower layer in the cavity filled with the carbon black-binder mixture are parallel.

One of the problems with the technique described by Gongora-Rubio et al. is that the carbon black is not evacuated completely from the cavity. Carbon black and or oxidation products thereof may remain in the cavity after firing is completed. Further, this method requires close control of the atmosphere during firing. Also, the carbon black may react with the LTCC material.

In another technique, Mylar or rubber inserts were inserted in the channels before lamination, and were mechanically pulled through holes in the substrate after lamination. Removal of the inserts is difficult and time consuming.

The prior art channel fabrication processes for LTCC devices are not compliant with current substrate fabrication techniques, or sufficiently versatile for arbitrary channel geometries. Further, the prior art techniques have high cost and are not sufficiently reliable for accurate feature preservation.

Other package cooling mechanisms have their disadvantages. Surface-mount cooling devices (sinks, fans and the like) are not volume efficient, and are inadequate for the next generation of miniaturized systems. Silicon micro-electromechanical systems (MEMS) based cooling systems use too much footprint on the substrate, and are not compliant with preferred electronic packaging techniques.

BRIEF DESCRIPTION OF THE DRAWINGS

FIG. 1A is a plan view of an exemplary LTCC tape configuration having channels formed therein.

FIG. 1B is a cross sectional view taken along section line 1B—1B of FIG. 1A.

FIG. 2A is a plan view of the LTCC tape configuration of FIG. 1A, in which the channels have been filled with a material.

FIG. 2B is a cross sectional view taken along section line 2B—2B of FIG. 2A.

FIG. 3A is a plan view of the LTCC tape configuration of FIG. 2A, to which a top layer having holes has been added.

FIG. 3B is a cross sectional view taken along section line 3B—3B of FIG. 3A.

FIG. 4A is a plan view of the LTCC configuration of FIG. 3A, after firing.

FIG. 4B is a cross sectional view taken along section line 4B—4B of FIG. 4A.

DETAILED DESCRIPTION

Experiments have shown that, if the stack of tape layers is supported to maintain straightness until lamination is complete, then the support can be removed without sagging, bowing or warpage. Thus, it is desirable to support the stack of tape layers at least until completion of the lamination step. The support can then be removed. Preferably, the support is provided by a fugitive material that fills the channel(s) during lamination, and is removed by melting, evaporation and/or burning out while the device is being fired to sinter the ceramic constituents of the tape.

An exemplary embodiment according to the invention includes a method for forming a low temperature cofired ceramic (LTCC) device. At least one channel is formed in at least a first LTCC tape layer. The at least one first LTCC tape layer may be a first tape substack containing, for example, 20 or more layers. A sacrificial or fugitive material is inserted in the channel. The fugitive material may be, for example, organic materials such as flour, cornstarch, or yeast. Preferred materials include wax, polyethylene, polystyrene, polypropylene, paraffin and combinations thereof. Preferably, the fugitive material is meltable.

At least one second LTCC tape layer is stacked on the first tape layer (or substack). The at least one second LTCC tape layer may be a second tape substack containing, for example, four or more layers. The first and second tape layers (or first and second tape substacks) are pressed sufficiently to form a laminate. Once pressing is completed, the laminate is able to maintain its shape without the fugitive material. All or substantially all of the fugitive material is removed from the channel, for example, by a combination of melting, vaporizing and/or burning out the fugitive material at a temperature below the sintering temperature. The device is fired at a sintering temperature sufficiently hot to sinter ceramic constituents in the first and second tape layers.

FIGS. 1A–4B show an example of a method for forming an LTCC device, and a device 400 formed by the method. The resulting device 400 has an embedded channel suitable for liquid cooling or other use. As used herein, the term, "channel" can refer to a passage, groove or tube having any of a variety of shapes and aspect ratios. The channel may be straight (e.g., channel 104), or the channel may include angles, curves, elliptical, circular or irregularly shaped portions (e.g., channel 105), or any combination thereof. The channel may extend to an end of the tape substrate (e.g., channel 104), or the channel may have its ends embedded within the interior of the substrate (e.g., channel 105).

The channel may have the same horizontal cross section in every tape layer through which the channel passes, forming vertical channel walls. A vertical cross section through such a multi-layer configuration would include a rectangular channel cross section. Alternatively, the channel may have two or more different cross sections in two or more respective tape layers. A vertical cross section through such a multi-layer configuration would include a non-rectangular polygonal channel, such as an "L" shape, or a grooved shape.

FIG. 1A is a plan view of an exemplary LTCC tape configuration 100 including a tape layer (or substack) 102 having channels 104, 105 formed therein. FIG. 1B is a cross sectional view of tape configuration 100 taken along section line 1B—1B of FIG. 1A. The channels 104, 105 may be formed by a conventional process, such as machining (e.g., milling, cutting or stamping), or through photolithographic techniques. In the example, the tape layer (or substack) 102 is milled so that a bottom portion of tape layer 102 provides the base of the channel. If the channels 104, 105 are stamped or cut all the way through tape layer 102, then a lower layer 101 beneath layer 102 provides the bottom of the channel.

A preferred LTCC, which is known in the art as "GREEN TAPE™", is commercially available from the DuPont Company of Wilmington, Del. The tape contains a material formulation which can be a mixture of glass and ceramic fillers which sinter at about 850° C. to 900° C., and exhibits thermal expansion similar to alumina. The low-temperature processing permits the use of air-fired resistors and precious metal thick film conductors such as gold, silver, or their alloys. Other tape systems may be used. For example, other LTCC systems or a high temperature cofired tape material may be used.

FIG. 2A is a plan view of the LTCC tape configuration 200, in which the channels 104, 105 have been filled with a fugitive material 120. FIG. 2B is a cross sectional view of filled tape configuration 200, taken along section line 2B—2B of FIG. 2A. In the example, the fugitive material 120 is a meltable material, which is preferably a wax. The fugitive material 120 may be granular, thermoplastic or a thermoset in nature. The exemplary wax 120 is a polyblend, such as a mixture of polypropylene and paraffin. Alternatively, a combination of paraffin and polypropylene or a combination of paraffin and polystryene may be used as preferred materials.

One of ordinary skill in the art can select a ratio of the polyblend constituents to achieve a desired temperature at which the material is completely removed from the device. In the preferred example, the polyblend includes approximately five parts of polypropylene and one part paraffin. Similar ratios may be used with polyblends containing either polystyrene or polyethylene. Preferably, the fugitive material 120 is of a type that burns out at a temperature below a sintering temperature of the LTCC tape layer 102. In the case of the exemplary polypropylene and paraffin polyblend, the material is completely burned out by the time the material reaches a temperature of about 550° C. to 600° C., well below the sintering temperature.

The fugitive material 120 may be inserted in a granular form as shown in FIG. 2. Alternatively, the fugitive material 120 may be cut or punched from a sheet into one-piece preforms shaped to fit the channels 104, 105. The preforms can then be inserted into the channels 104, 105. As another alternative, if the fugitive material is a thermosetting material, the fugitive material may be poured or spread in the channel in a liquid or paste form, and them cured at a relatively low temperature. Preforms may also be molded. An example of a material that could be molded separately is a silicon adhesive, such as a room temperature vulcanizer (RTV) material.

FIG. 3A is a plan view of the LTCC tape configuration, in which at least a second LTCC tape layer (or substack) 103 having holes 140 has been added on the first LTCC tape layer 102 to form a stack 300. FIG. 3B is a cross sectional view of the stack 300 taken along section line 3B—3B of FIG. 3A. In the example, the holes 140 are the same holes that are used to conduct coolant into and out from the channels 104, 105 during operation of the device 400, so that no additional holes are needed to allow egress of the fugitive material. It is also possible to provide extra holes for egress of the fugitive material, that are not used to conduct coolant.

During the lamination step, the stack is pressed sufficiently for the first layer 102 and second layer 103 to bond into a laminate. The lamination force may be isostatic, semi-isostatic, or uniaxial. Typical lamination temperature and pressure are approximately 3000 psi at a temperature of 70° C. to 80° C. At this low temperature, the various layers 101–103 cohere to each other, but material is not yet sintered. Nevertheless, the laminate is capable of maintaining its shape without sagging, bowing or warping, even if the material 120 is removed.

The stack is oriented for lamination and firing in a position that is optimized for removal of the fugitive material 120. For example, if the fugitive material is a meltable material, the stack 300 can be oriented with layer 103 on the bottom (with the holes 140 below the channels 104, 105)

during lamination and firing. This may allow a first portion of the material 120 to melt and drain from one or more of the holes 140 in the LTCC tape 103 during firing. Then a second portion of the material 120 that does not drain from the one or more holes 140 is burned out during firing. During the burning, the fugitive material is decomposed to low molar mass constituents (e.g., carbon monoxide, carbon dioxide) which outgas. In the case of materials that do not melt or do not readily drain, the stack can still be oriented with the holes 140 below the channels to allow any decomposition products that are heavier than air to escape more easily.

FIG. 4A is a plan view of the sintered device 400, after firing. FIG. 4B is a cross sectional view of device 400 taken along section line 4B—4B of FIG. 4A. The laminate 300 is fired at a sintering temperature sufficiently high to sinter ceramic components of the first and second LTCC tapes 102, 103 into a unitary structure 402. Preferably, during the firing step, all or substantially all of the material 120 is removed from the channel by a combination of melting, vaporization and burning out. Because the exemplary material burns out completely by the time it reaches 550° C. to 600° C., heating the assembly 400 to the sintering temperature (e.g., 800° C. to 850° C.) ensures complete removal of the material 120.

The exemplary method simplifies and streamlines the LTCC fabrication process by eliminating mult-step laminations, thereby reducing the cost of fabrication (in terms of labor required). This exemplary method preserves feature geometries by using the insert material as a negative mold. Because material 120 can withstand the temperatures and pressures of the feature-critcal steps in fabrication and then burn out completely through a typical LTCC firing process, the method eliminates virtually all cavity deformation in the substrate. The exemplary method uses materials of low cost with no additional equipment required over that typically available in a fabrication lab.

A device 400 is thus formed by the process comprising the steps of: forming a channel 104 in a first tape layer (or substack) 102, inserting a meltable material 120 in the channel, stacking at least a second tape layer (or substack) 103 on the at least one first tape layer, pressing the first and second tape layers sufficiently to form a laminate 300 that is able to maintain its shape without the meltable material, and removing all or substantially all of the meltable material from the channel.

Also, a device 400 may be formed by the method that comprises the steps of: forming a channel 104 in a first LTCC tape (or substack) 102; inserting a material 120 in the channel (the material selected from, for example, a wax, polyethylene, polystyrene, polypropylene, paraffin or combinations thereof); stacking at least a second LTCC tape (or substack) 103 on the first tape to form a stack; firing the stack at a sintering temperature sufficiently high to sinter ceramic components of the first and second LTCC tapes into a unitary structure 400; and removing all or substantially all of the material from the channel.

The exemplary method described above is compliant with current substrate fabrication techniques, because it can be fabricated on the same ceramic substrate with high-density electronic interconnects. It is versatile, and allows for arbitrary channel geometries, opening the door to new applications. The exemplary device is fabricated in LTCC, which is considered hermetic. This method provides a low cost solution, and requires less additional labor than other known techniques. Experiments have shown good reliability in terms of maintaining the channel shape during lamination and firing.

Although the exemplary channel is used for conducting a liquid coolant, the channel may be used for a gas cooled substrate, or of an embedded heat pipe. Although the example described above involves cooling of dense electronics and miniaturized systems, the method may also be used for channels for antenna design and control and waveguide fabrication. The method may be used for any application that includes a fluidic interface from silicon MEMS to a substrate.

Although the invention has been described in terms of exemplary embodiments, it is not limited thereto. Rather, the appended claim should be construed broadly, to include other variants and embodiments of the invention, which may be made by those skilled in the art without departing from the scope and range of equivalents of the invention.

What is claimed is:

1. A method for forming a low temperature cofired ceramic (LTCC) device, comprising the steps of:
    (a) forming a channel in at least a first LTCC tape layer;
    (b) inserting a wax in the channel, the wax being of a type that burns out at a temperature below a sintering temperature of the first LTCC tape layer;
    (c) stacking at least a second LTCC tape layer on the first LTCC tape layer to form a stack;
    (d) Pressing the stack sufficiently for the first and second layers to bond into a laminate; and
    (e) firing the laminate at the sintering temperature to form a sintered ceramic structure from the first and second LTCC tape layers, whereby all or substantially all of the wax is burned out from the channel;
    wherein the wax is in granular form during step (b);
    wherein the wax is a blend of polypropylene and paraffin.

2. The method of claim 1, wherein the blend includes approximately five parts of polypropylene and one part paraffin.

3. A method for forming a device, comprising the steps of:
    (a) forming a channel in at least a first tape layer;
    (b) inserting a meltable material in the channel;
    (c) stacking at least a second tape layer on the first tape layer;
    (d) pressing the first and second tape layers sufficiently to form a laminate; and
    (e) removing all or substantially all of the meltable material from the channel;
    wherein the device is a low temperature cofired ceramic device, and the first and second tape layers are low temperature cofired tape, the method further comprising:
    (f) firing the device at a sintering temperature sufficiently hot to sinter ceramic constituents in the first and second tape layers;
    wherein step (e) includes burning out the meltable material at a temperature below the sintering temperature;
    wherein the meltable material is a wax;
    wherein the meltable material is a blend of polypropylene and paraffin.

4. The method of claim 3, wherein the blend includes approximately five parts of polypropylene and one part paraffin.

5. In a method for forming a device comprising the steps of forming a channel in a first tape layer, stacking at least a second tape layer on the first tape layer; and firing the stack to sinter ceramic components of the first and second tape layers, the improvement comprising:

(a) inserting a meltable material in the channel before stacking; and (b) removing all or substantially all of the meltable material from the channel during firing;

further comprising pressing the stack sufficiently to form a laminate that is able to maintain its share without the meltable material between steps (a) and (b);

wherein the meltable material is in granular form during step (a);

wherein the meltable material is a blend of polypropylene and paraffin.

6. The method of claim 5, wherein the blend includes approximately five parts of polypropylene and one part paraffin.

7. The method of claim 5 wherein the second tape layer includes at least one hole, and the stack is oriented with the hole below the channel during step (b).

* * * * *